United States Patent
Momose

(10) Patent No.: US 8,619,137 B2
(45) Date of Patent: Dec. 31, 2013

(54) IN-VEHICLE APPARATUS AND IN-VEHICLE APPARATUS SYSTEM

(75) Inventor: Takeshi Momose, Saitama (JP)

(73) Assignee: Sony Corporation, Tokyo (JP)

( * ) Notice: Subject to any disclaimer, the term of this patent is extended or adjusted under 35 U.S.C. 154(b) by 401 days.

(21) Appl. No.: 12/894,672

(22) Filed: Sep. 30, 2010

(65) Prior Publication Data

US 2011/0109714 A1    May 12, 2011

(30) Foreign Application Priority Data

Nov. 6, 2009   (JP) ................................. 2009-255176

(51) Int. Cl.
*H04N 7/18*      (2006.01)

(52) U.S. Cl.
USPC ........................................................ 348/148

(58) Field of Classification Search
USPC .............................................. 348/14.04, 148
See application file for complete search history.

(56) References Cited

U.S. PATENT DOCUMENTS

| | | | | |
|---|---|---|---|---|
| 4,450,487 A | * | 5/1984 | Koide | 386/200 |
| 4,789,905 A | * | 12/1988 | Ezaki | 386/209 |
| 5,649,838 A | * | 7/1997 | Sung | 439/578 |
| 5,681,183 A | * | 10/1997 | Dzmura | 439/502 |
| 6,069,960 A | * | 5/2000 | Mizukami et al. | 381/74 |
| 6,288,747 B1 | * | 9/2001 | Avalos et al. | 348/485 |
| 6,907,615 B1 | * | 6/2005 | Alexander et al. | 725/80 |
| 2004/0098571 A1 | * | 5/2004 | Falcon | 713/1 |
| 2005/0142916 A1 | * | 6/2005 | Larn | 439/188 |
| 2006/0177076 A1 | * | 8/2006 | Labarca et al. | 381/111 |
| 2007/0071251 A1 | * | 3/2007 | MacDuff | 381/81 |
| 2007/0153132 A1 | * | 7/2007 | Jong | 348/705 |
| 2009/0299572 A1 | * | 12/2009 | Fujikawa et al. | 701/36 |

FOREIGN PATENT DOCUMENTS

| | | |
|---|---|---|
| JP | 9-37189 | 2/1997 |
| JP | 2003-283957 | 10/2003 |

* cited by examiner

*Primary Examiner* — Sath V Perungavoor
*Assistant Examiner* — Peter D Le
(74) *Attorney, Agent, or Firm* — Oblon, Spivak, McClelland, Maier & Neustadt, L.L.P.

(57) ABSTRACT

An in-vehicle apparatus includes: a main body part; an analog input terminal; a video processing circuit; an audio processing circuit; an input control circuit; and a microcomputer.

5 Claims, 9 Drawing Sheets

FIG.1
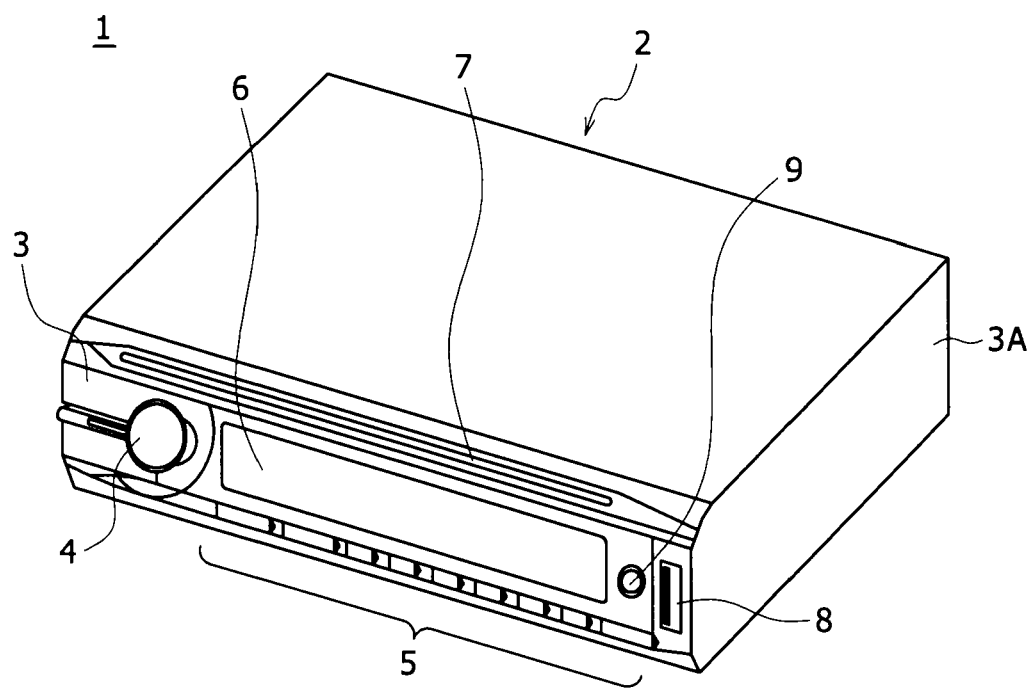
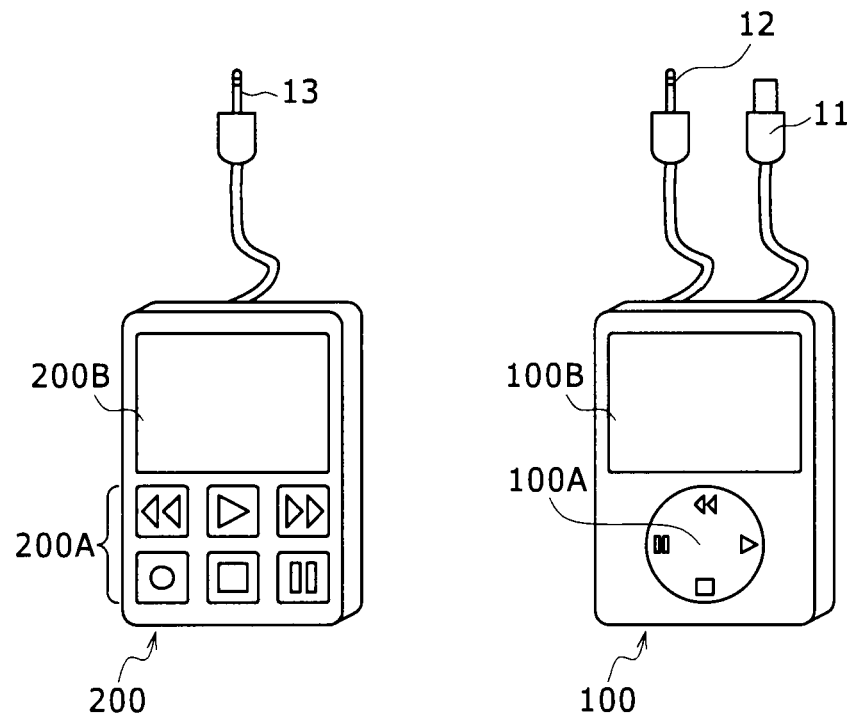

F I G . 5
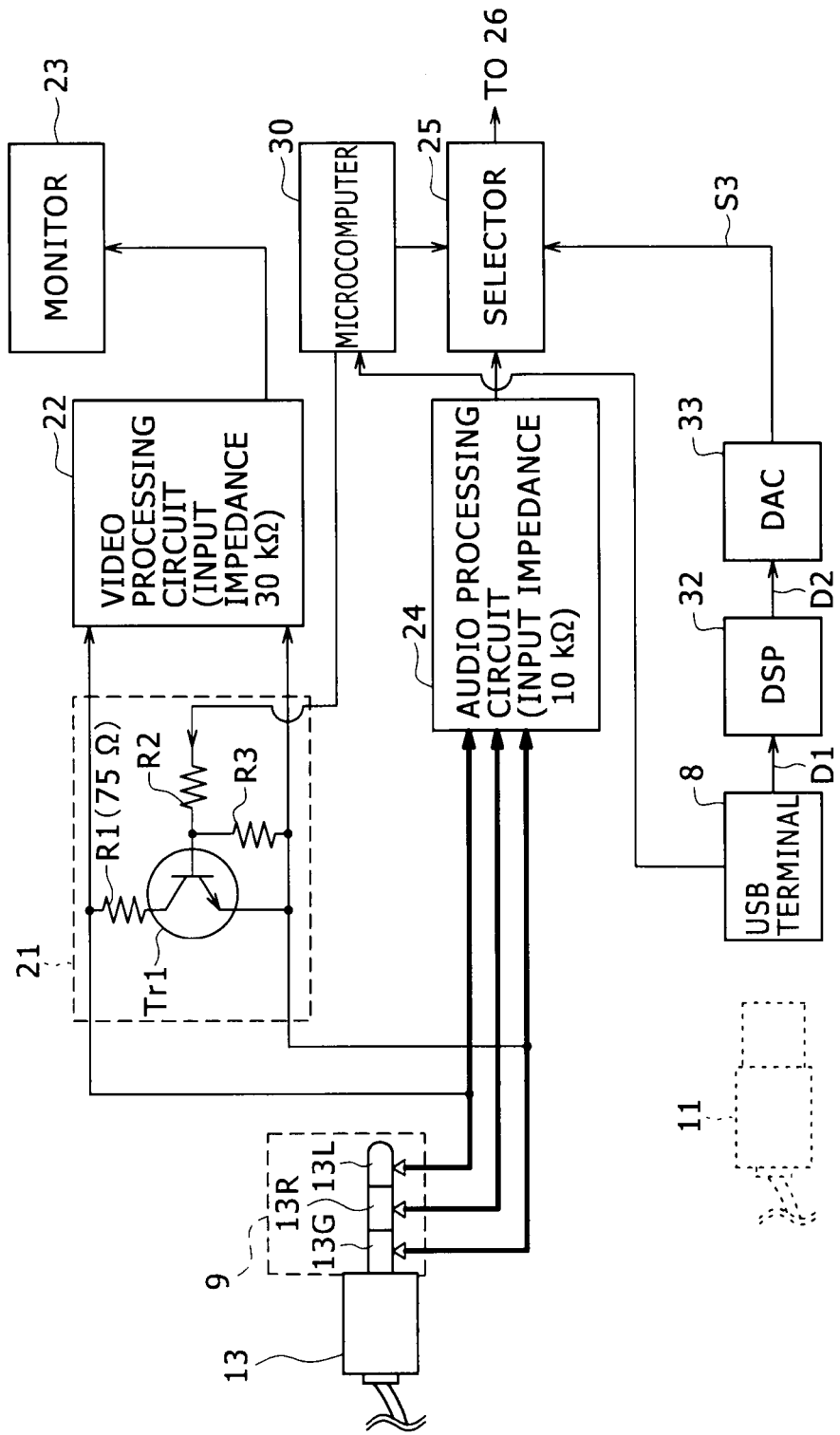

IN-VEHICLE APPARATUS AND IN-VEHICLE APPARATUS SYSTEM

BACKGROUND OF THE INVENTION

1. Field of the Invention

The present invention relates to an in-vehicle apparatus and an in-vehicle apparatus system, and is suitable to be applied to e.g. a car audio device for in-vehicle use.

2. Description of the Related Art

The car audio device is increasingly provided with an external input terminal compatible with a three-pole plug for audio input in order to allow connection of an external portable player.

It is becoming possible for the portable player to reproduce not only music but also a moving image. However, because the screen of the portable player itself is small, it is becoming general to output video to an external large monitor.

To view video reproduced by a portable player on a large-size monitor connected to a car audio device, an input terminal for video needs to be newly provided in the car audio device. However, it is difficult to add the new input terminal because there is a limit to the size of the front panel.

As a countermeasure against this problem, another company employs a method in which a video signal is physically separated from an audio signal by using a special four-pole plug (audio L, audio R, GND, and video) and a video input terminal is used also as an audio input terminal.

However, if such a special four-pole plug is used, the cost is increased compared with the general three-pole plug and general versatility is lost.

On the other hand, there has been proposed an in-vehicle display device in which a general AV composite jack doubles as an AV composite jack for a navigation system and switching is carried out by an analog switch circuit (refer to e.g. Japanese Patent Laid-open No. Hei 9-37189).

SUMMARY OF THE INVENTION

In the in-vehicle display device described in this patent document, because the analog switch circuit is used, the contact resistance when this switch circuit is turned on is high. This leads to a problem that, in the video system, whose output impedance is as low as 75Ω, the signal level of the video signal varies and becomes unstable due to the contact resistance and the image quality is lowered.

There is a need for the present invention to propose an in-vehicle apparatus and an in-vehicle apparatus system that are capable of outputting without the deterioration of the image quality and have high general versatility.

According to a first mode of the present invention, there is provided an in-vehicle apparatus including a main body part configured to have a front panel of a predetermined size, and an analog input terminal configured to be provided in the front panel. An analog audio signal or an analog video signal supplied from the external is input to the analog input terminal. The in-vehicle apparatus further includes a video processing circuit configured to be connected to the analog input terminal and execute predetermined signal processing for the analog video signal, and an audio processing circuit configured to be connected to the analog input terminal and execute predetermined signal processing for the analog audio signal. The in-vehicle apparatus further includes an input control circuit configured to have a resistor that is provided between the analog input terminal and the video processing circuit and functions for impedance matching for the analog video signal, and a transistor that is connected to the resistor for impedance matching and serves as a switching element. The in-vehicle apparatus further includes a microcomputer configured to allow impedance matching through the resistor for impedance matching by making the transistor carry out on-operation if a signal supplied via the analog input terminal is the analog video signal.

Due to this configuration, when the analog video signal is supplied via the analog input terminal, the impedance matching can be achieved through the resistor for impedance matching by making the transistor carry out on-operation. Thus, the contact resistance is very lower compared with the related art in which an analog switch circuit is used. Consequently, variation of the signal level can be suppressed and the image quality deterioration can be prevented.

According to a second mode of the present invention, there is provided an in-vehicle apparatus system including an in-vehicle apparatus and a player connected to the in-vehicle apparatus. The in-vehicle apparatus includes a main body part configured to have a front panel of a predetermined size, and an analog input terminal configured to be provided in the front panel. An analog audio signal supplied from the player or an analog video signal supplied from the player is input to the analog input terminal. The in-vehicle apparatus further includes a video processing circuit configured to be connected to the analog input terminal and execute predetermined signal processing for the analog video signal, and an audio processing circuit configured to be connected to the analog input terminal and execute predetermined signal processing for the analog audio signal. The in-vehicle apparatus further includes an input control circuit configured to have a resistor that is provided between the analog input terminal and the video processing circuit and functions for impedance matching for the analog video signal, and a transistor that is connected to the resistor for impedance matching and serves as a switching element. The in-vehicle apparatus further includes a microcomputer configured to allow impedance matching through the resistor for impedance matching by making the transistor carry out on-operation if a signal supplied via the analog input terminal is the analog video signal.

Due to this configuration, when the analog video signal is supplied via the analog input terminal, the impedance matching can be achieved through the resistor for impedance matching by making the transistor carry out on-operation. Thus, the contact resistance is very lower compared with the related art in which an analog switch circuit is used. Consequently, variation of the signal level can be suppressed and the image quality deterioration can be prevented.

According to the modes of the present invention, when the analog video signal is supplied via the analog input terminal, the impedance matching can be achieved through the resistor for impedance matching by making the transistor carry out on-operation. This can realize an in-vehicle apparatus and an in-vehicle apparatus system in which the contact resistance is very lower compared with the related art in which an analog switch circuit is used and the image quality deterioration can be prevented through the suppression of variation of the signal level.

BRIEF DESCRIPTION OF THE DRAWINGS

FIG. 1 is a schematic perspective view showing the entire configuration of a car audio system;

FIG. 5 is a schematic diagram for explaining the operation of the car audio device when audio is input;

DETAILED DESCRIPTION OF THE PREFERRED EMBODIMENTS

Figure 2:
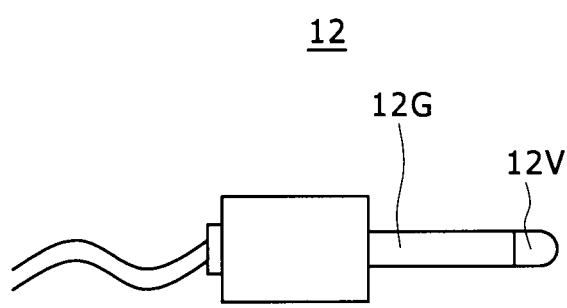
FIG. 2 is a schematic diagram of the structure of a video two-pole plug.

Embodiments of the present invention will be described below. The order of the description is as follows.
1. Embodiment
2. Other Embodiments

1. Embodiment

1-1. Entire Configuration of Car Audio System

In FIG. 1, numeral 1 denotes a car audio system as a whole. The car audio system 1 is composed of a car audio device 2, a portable digital player 100 connected to the car audio device 2, and a portable analog audio player 200 connected to the car audio device 2.

The car audio device 2 is envisaged to be mounted in the dashboard (not shown) of a vehicle in such a way that a main body part 3A integrated with a front panel 3 is buried in the dashboard. When being mounted in the dashboard, the car audio device 2 is used in such a state that only the front panel 3 is mainly exposed.

In practice, this car audio device 2 is compliant with the so-called DIN (Deutsche Industrie Normen), and the main body part 3A is formed into the so-called 1-DIN size, in which the lateral width is about 178 mm and the height is about 50 mm.

The front panel 3 is provided with a rotary commander 4 for accepting rotational operation and pressing operation by the user, a various kinds of operation buttons group 5, and a display unit 6 formed of a liquid crystal display (LCD), an organic electroluminescence (EL) display, or another display for providing various kinds of information to the user. The front panel 3 functions as a so-called user interface.

In the front panel 3, an insertion slot 7 to insert a disc-shape recording medium such as a compact disc (CD) and a digital versatile disc (DVD) is provided at an upper part of the surface thereof. In addition, a universal serial bus (USB) terminal 8 and an AUX (Auxiliary)/VIN (VideoIN) terminal 9 are juxtaposed at a right part of this surface.

A speaker (not shown) and a large-size (e.g. 7-inch) monitor (not shown) are connected to the main body part 3A of the car audio device 2. The car audio device 2 displays, on the monitor, video as the result of reproduction of data in a disc-shape recording medium, and outputs audio as the result of reproduction from the speaker.

The portable digital player 100 has an operating unit 100A to input various kinds of commands for play, stop, select, etc. and a display unit 100B formed of an LCD, an organic EL display, or the like. The display unit 100B displays various kinds of data such as the music title and the elapsed time of play when the reproduction subject is music in a CD or the like, and displays reproduced video and so forth when the reproduction subject is moving image content in a DVD or the like.

The portable digital player 100 is based on such specifications as to output audio as digital audio data via a USB connector 11 and output video as an analog video signal via a video two-pole plug 12.

In practice, the portable digital player 100 is connected to the car audio device 2 physically and electrically by insertion of the USB connector 11 into the USB terminal 8 of the car audio device 2 and insertion of the video two-pole plug 12 into the AUX/VIN terminal 9 of the car audio device 2.

This allows the portable digital player 100 to output digital audio data to the car audio device 2 via the USB connector 11 and the USB terminal 8 and output an analog video signal to the car audio device 2 via the video two-pole plug 12 and the AUX/VIN terminal 9.

When music is selected as the reproduction subject, it is enough that only the USB connector 11 is connected to the car audio device 2, and the portable digital player 100 outputs only digital audio data as a reproduction result to the car audio device 2.

When moving image content is selected as the reproduction subject, the portable digital player 100 outputs the video part of this moving image content as an analog video signal to the car audio device 2 via the video two-pole plug 12.

At this time, the portable digital player 100 outputs the audio part of this moving image content as digital audio data to the car audio device 2 via the USB connector 11.

As shown in FIG. 2, the video two-pole plug 12 of the portable digital player 100 is formed of a two-pole configuration in which a video signal terminal 12V is formed at the tip part and a ground terminal 12G is formed at the root part.

The portable analog audio player 200 (FIG. 1) has an operation button group 200A to input various kinds of commands for play, stop, select, etc. and a display unit 200B that displays various kinds of data about the reproduction subject, such as the music title, the artist name, and the elapsed time of play, and is formed of an LCD, an organic EL display, or the like. The portable analog audio player 200 outputs a reproduction result as an analog audio signal.

In practice, the portable analog audio player 200 is connected to the car audio device 2 physically and electrically by insertion of an audio three-pole plug 13 into the AUX/VIN terminal 9 of the car audio device 2.

Thereby, the portable analog audio player 200 outputs an analog audio signal to the car audio device 2 via the audio three-pole plug 13 (audio L, audio R, GND) and the AUX/VIN terminal 9, and audio corresponding to the analog audio signal is output from the speaker via the car audio device 2.

Figure 3:
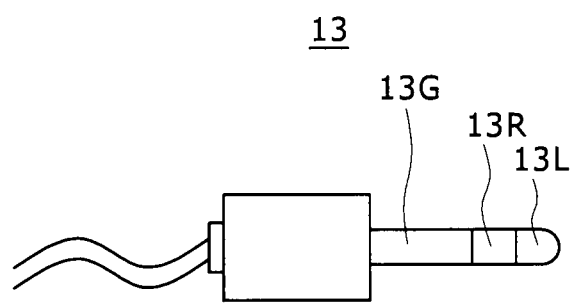
FIG. 3 is a schematic diagram showing the structure of an audio three-pole plug.

As shown in FIG. 3, the audio three-pole plug 13 of the portable analog audio player 200 has a general three-pole structure. Specifically, it is formed of a three-pole configuration in which an audio L-channel terminal 13L, an audio R-channel terminal 13R, and a ground terminal 13G are formed in that order along the direction from the tip part to the root part.

The physical size and so forth is the same between the video two-pole plug 12 of the portable digital player 100 and the audio three-pole plug 13 of the portable analog audio player 200, and only the terminal arrangement structure is different therebetween. Thus, both plugs can be inserted into the AUX/VIN terminal 9.

That is, the AUX/VIN terminal 9 is used both as the terminal for video and as the terminal for audio so that both of the video two-pole plug 12 of the portable digital player 100 and the audio three-pole plug 13 of the portable analog audio player 200 may be treated as the connection subject.

1-2. Circuit Configuration of Car Audio Device

Figure 4:
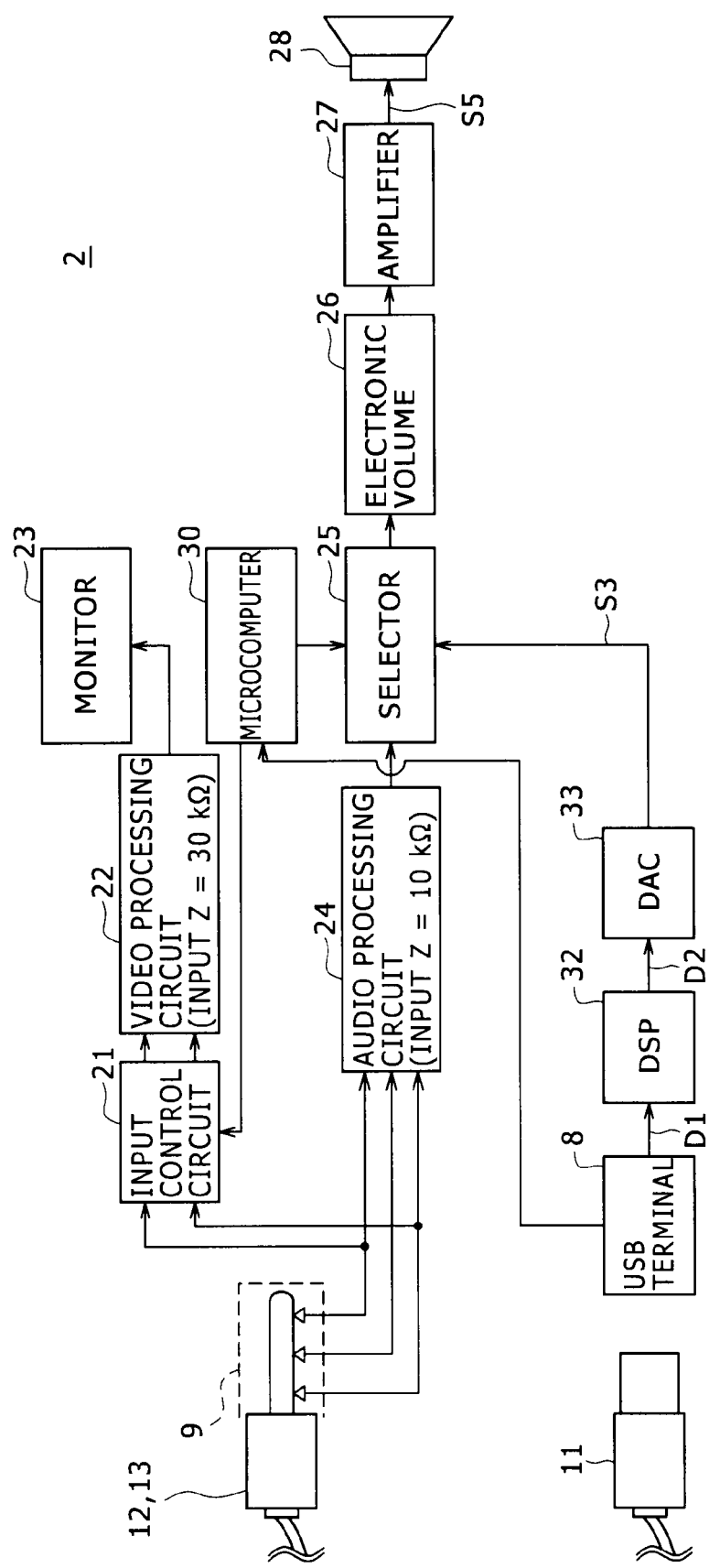
FIG. 4 is a schematic block diagram showing the circuit configuration of a car audio device.

As shown in FIG. 4, in the car audio device 2, a microcomputer 30 formed of a central processing unit (CPU) configuration overall-controls the operation of the entire device in accordance with a basic program or the like that is read out from a read only memory (ROM) and launched in a random access memory (RAM).

In practice, the microcomputer 30 of the car audio device 2 always monitors whether or not the USB connector 11 is connected to the USB terminal 8 of the front panel 3. Upon detecting connection of the USB connector 11, the microcomputer 30 receives digital audio data D1 from the portable digital player 100 via the USB connector 11 and sends it to a digital signal processor (DSP) 32.

The DSP 32 executes predetermined data decoding processing and so forth for the digital audio data D1 and sends digital audio data D2 resulting from the processing to a digital-analog converter 33.

The digital-analog converter 33 converts the digital audio data D2 to an analog audio signal S3 and sends it to an electronic volume 26 via a selector 25. The electronic volume 26 adjusts the audio signal S3 to the volume level in accordance with the rotational operation of the rotary commander 4 and sends an audio signal S4 resulting from the adjustment to an amplifier 27.

The amplifier 27 amplifies the audio signal S4 to a predetermined level and sends an audio signal S5 resulting from the amplification to a speaker 28 to thereby output reproduced audio dependent on the audio signal S5 from the speaker 28.

The microcomputer 30 of the car audio device 2 switches the selector 25 to the side of the USB terminal 8 if connection of the USB connector 11 is detected via the USB terminal 8. The microcomputer 30 switches the selector 25 to the side of an audio processing circuit 24 if connection of the USB connector 11 is not detected.

Specifically, the case in which connection of the USB connector 11 is detected via the USB terminal 8 means that the connection subject of the car audio device 2 is not the portable analog audio player 200 but the portable digital player 100.

In this case, the microcomputer 30 of the car audio device 2 switches the selector 25 to the side of the USB terminal 8 because audio as the digital audio data D1 is inevitably input via the USB connector 11 no matter whether music or moving image content is selected as the reproduction subject in the portable digital player 100.

In contrast, when connection of the USB connector 11 is not detected, this means that the connection subject is the portable analog audio player 200 and the digital audio data D1 is not input from the USB terminal 8. Therefore, the microcomputer 30 of the car audio device 2 switches the selector 25 to the side of the audio processing circuit 24.

In practice, if the audio three-pole plug 13 of the portable analog audio player 200 is connected to the AUX/VIN terminal 9, the microcomputer 30 of the car audio device 2 switches the selector 25 to the side of the audio processing circuit 24 because connection of the USE connector 11 is not detected.

Simultaneously, the microcomputer 30 of the car audio device 2 controls an input control circuit 21 including an NPN transistor Tr1 used as a switching element and an impedance matching resistor R1 used for impedance matching as shown in FIG. 5.

In the car audio device 2, the audio processing circuit 24 connected to the AUX/VIN terminal 9 and a video processing circuit 22 connected to the AUX/VIN terminal 9 are provided in parallel to each other, and the input control circuit 21 is provided between connection lines between the AUX/VIN terminal 9 and the video processing circuit 22.

When the audio three-pole plug 13 is actually inserted into the AUX/VIN terminal 9, the input control circuit 21 is electrically connected to the audio L-channel terminal 13L and the ground terminal 13G. The input control circuit 21 switches the input from the AUX/VIN terminal 9 in accordance with control from the microcomputer 30.

Even when the audio three-pole plug 13 is inserted into the AUX/VIN terminal 9, the input control circuit 21 is not electrically connected to the audio R-channel terminal 13R of the audio three-pole plug 13.

The collector of the transistor Tr1 of the input control circuit 21 is connected to the audio L-channel terminal 13L via the impedance matching resistor R1 of 75Ω. The base thereof is connected to the microcomputer 30 via a base resistor R2, and the emitter thereof is connected to the ground terminal 13G.

Between the base of the transistor Tr1 and the ground terminal 13G in the AUX/VIN terminal 9, a resistor R3 for stabilizing the base current of the transistor Tr1 is provided.

In practice, the microcomputer 30 of the car audio device 2 switches the selector 25 to the side of the audio processing circuit 24 and makes the transistor Tr1 of the input control circuit 21 carry out off-operation if the audio three-pole plug 13 of the portable analog audio player 200 is connected to the AUX/VIN terminal 9 and connection of the USB connector 11 is not connected.

The following description will be made based on the assumption that, in the car audio device 2, the input impedance of the video processing circuit 22 is 30 KΩ and the input impedance of the audio processing circuit 24 is 10 KΩ. However, the values of the input impedance are not necessarily limited thereto.

In this case, in the car audio device 2, the transistor Tr1 of the input control circuit 21 carries out off-operation. Thus, the input impedance of the video processing circuit 22 is 30 KΩ as it is from the viewpoint of the side of the AUX/VIN terminal 9, and the audio input side is not affected by the video input side.

Therefore, in the car audio device 2, an analog audio signal from the audio three-pole plug 13 is sent to the electronic volume 26 via the audio processing circuit 24 and the selector 25, so that audio is output via the amplifier 27 and the speaker 28.

The microcomputer 30 of the car audio device 2 carries out the following control if the video two-pole plug 12 of the portable digital player 100 is connected to the AUX/VIN terminal 9 and connection of the USB connector 11 to the USB terminal 8 is detected.

Figure 6:
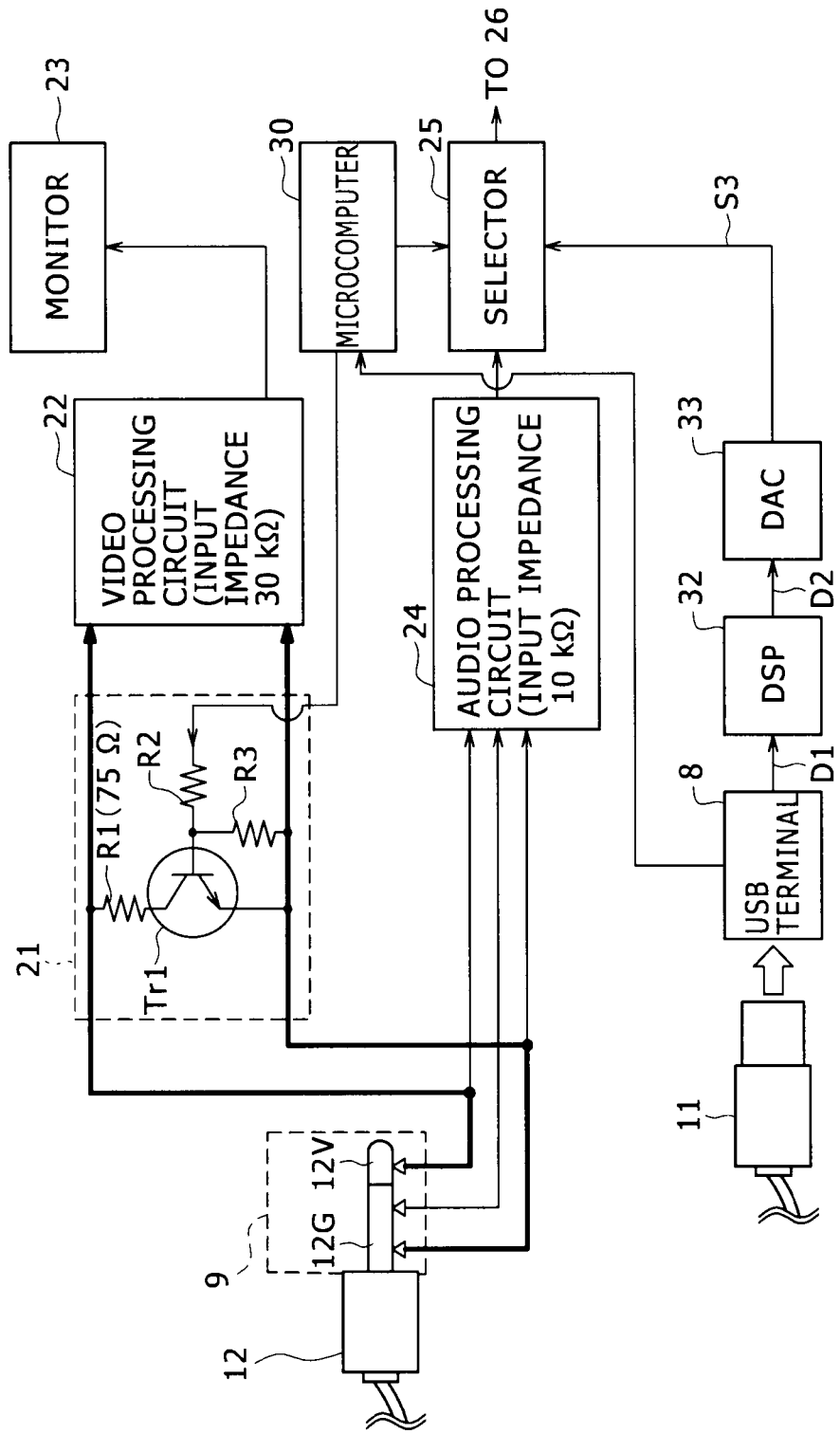
FIG. 6 is a schematic diagram for explaining the operation of the car audio device when video is input.

Specifically, as shown in FIG. 6, the microcomputer 30 of the car audio device 2 switches the selector 25 to the side of the USB terminal 8 and makes the transistor Tr1 of the input control circuit 21 carry out on-operation.

In the video two-pole plug 12, the video signal terminal 12V is formed at the same position as that of the audio L-channel terminal 13L of the audio three-pole plug 13, and the ground terminal 12G is formed at the same position as that of the audio R-channel terminal 13R and the ground terminal 13G.

Therefore, if the video two-pole plug 12 of the portable digital player 100 is connected to the AUX/VIN terminal 9, in the car audio device 2, the collector of the transistor Tr1 of the input control circuit 21 is connected to the video signal terminal 12V via the impedance matching resistor R1 of 75Ω, and the emitter is connected to the ground terminal 12G.

That is, in the car audio device 2, due to the on-operation of the transistor Tr1 of the input control circuit 21 and conduction between the collector and emitter of the transistor Tr1, the impedance matching resistor R1 of 75Ω is connected between the video signal terminal 12V and the ground.

At this time, in the car audio device 2, the input impedance of the whole of the input control circuit 21 and the video processing circuit 22, which serve as the receiver of an analog video signal, is almost 75Ω from the viewpoint of the side of the AUX/VIN terminal 9.

As a result, in the car audio device 2, the output impedance when the analog video signal is output from the video signal terminal 12V of the video two-pole plug 12 (75Ω) can be made to match the input impedance of the whole of the input control circuit 21 and the video processing circuit 22, which serve as the receiver of the analog video signal (almost 75Ω).

This allows the microcomputer 30 of the car audio device 2 to receive the analog video signal from the video two-pole plug 12 via the AUX/VIN terminal 9 and send it to the video processing circuit 22 via the input control circuit 21.

The video processing circuit 22 executes predetermined signal processing for the analog video signal, and then outputs the analog video signal to a monitor 23 to thereby display reproduced video.

In practice, in the car audio device 2, the impedance matching resistor R1 (75Ω) of the input control circuit 21 and the video processing circuit 22 (30 KΩ) are connected in parallel. If the input impedance of the whole of the input control circuit 21 and the video processing circuit 22 is defined as $R_Z$, the resistance of the impedance matching resistor R1 (75Ω) is defined as $R_A$, and the input impedance of the video processing circuit 22 is defined as $R_B$, the input impedance $R_Z$ is represented by the following expression.

$$R_Z = R_A \cdot R_B / (R_A + R_B) \quad (1)$$

When the actual numerical values are substituted in this expression (1), the input impedance $R_Z$ of the whole of the input control circuit 21 and the video processing circuit 22 is 74.813Ω, which is almost equal to 75Ω.

That is, in the car audio device 2, the output impedance when the analog video signal is output from the video signal terminal 12V of the video two-pole plug 12 (75Ω) is made to substantially match the input impedance of the whole of the input control circuit 21 and the video processing circuit 22 (74.813Ω). This makes it possible to avoid the image quality lowering due to signal level variation of the video signal in advance.

In the car audio device 2, not only the video processing circuit 22 (30 KΩ) but also the audio processing circuit 24 is connected in parallel to the impedance matching resistor R1 (75Ω) of the input control circuit 21 in practice.

Therefore, if the audio processing circuit 24 is also taken into consideration and the input impedance is similarly calculated by using expression (1), in the car audio device 2, the input impedance $R_Z'$ of the whole of the input control circuit 21, the video processing circuit 22, and the audio processing circuit 24 from the viewpoint of the side of the AUX/VIN terminal 9 is 74.257Ω. Thus, the input impedance is almost equal to 75Ω also in this case.

As just described, in the car audio device 2, the input impedance $R_Z$ (74.813Ω) of the whole of the input control circuit 21 and the video processing circuit 22, which serve as the receiver of the analog video signal, is affected by the audio processing circuit 24 (10 KΩ) connected in parallel to the impedance matching resistor R1 (75Ω) in practice.

However, in the car audio device 2, 10 KΩ is an ignorable level because 74.813Ω<<10 KΩ, and thus the input impedance $R_Z'$ of the whole of the input control circuit 21, the video processing circuit 22, and the audio processing circuit 24 from the viewpoint of the side of the AUX/VIN terminal 9 is 74.257Ω, which is almost equal to 75Ω. Therefore, the video input side is hardly affected by the audio input side.

1-3. Circuit Configuration of Portable Digital Player

Figure 7:
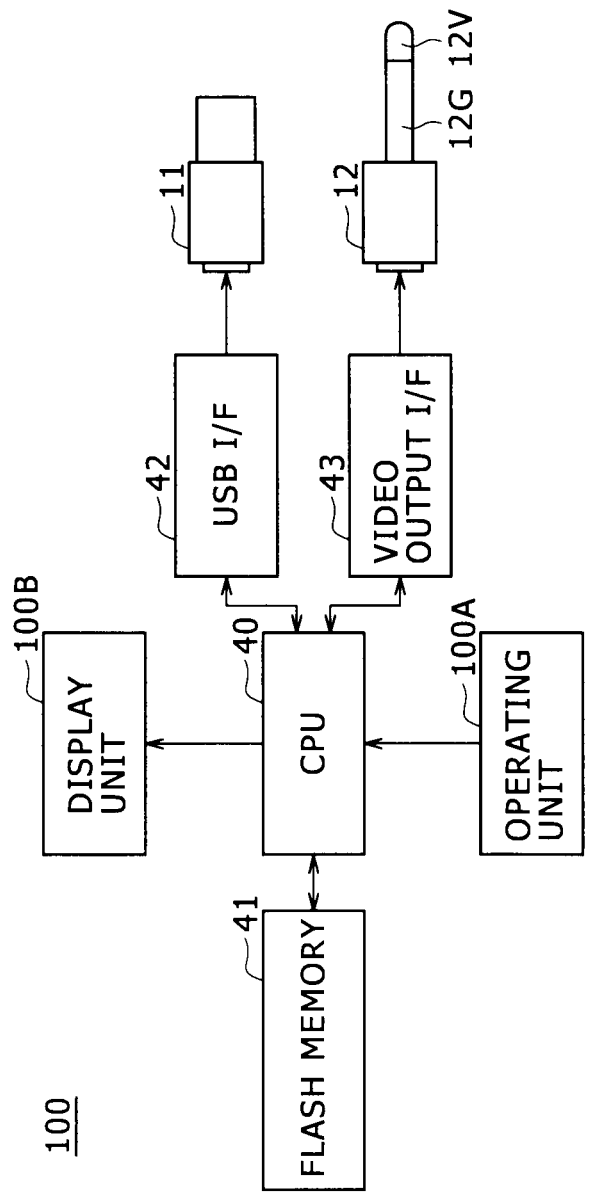
FIG. 7 is a schematic block diagram showing the circuit configuration of a portable digital player.

As shown in FIG. 7, in the portable digital player 100, a CPU 40 overall-controls the entire player in accordance with a basic program that is read out from a flash memory 41 and activated, and reproduces music and moving image content in response to a command supplied from an operating unit 100A.

For example, when a command to reproduce music is supplied, the CPU 40 of the portable digital player 100 reads out the digital audio data D1 stored in the flash memory 41 and outputs it from a USB interface 42 via the USB connector 11 to the car audio device 2.

When a command to reproduce moving image content is supplied, the CPU 40 of the portable digital player 100 outputs the video part of the moving image content as an analog video signal from a video output interface 43 via the video two-pole plug 12 to the car audio device 2.

Simultaneously, the CPU 40 of the portable digital player 100 outputs the audio part of the moving image content as digital audio data from the USB interface 42 via the USB connector 11 to the car audio device 2.

1-4. Output Path Depending on Input

Figure 8:
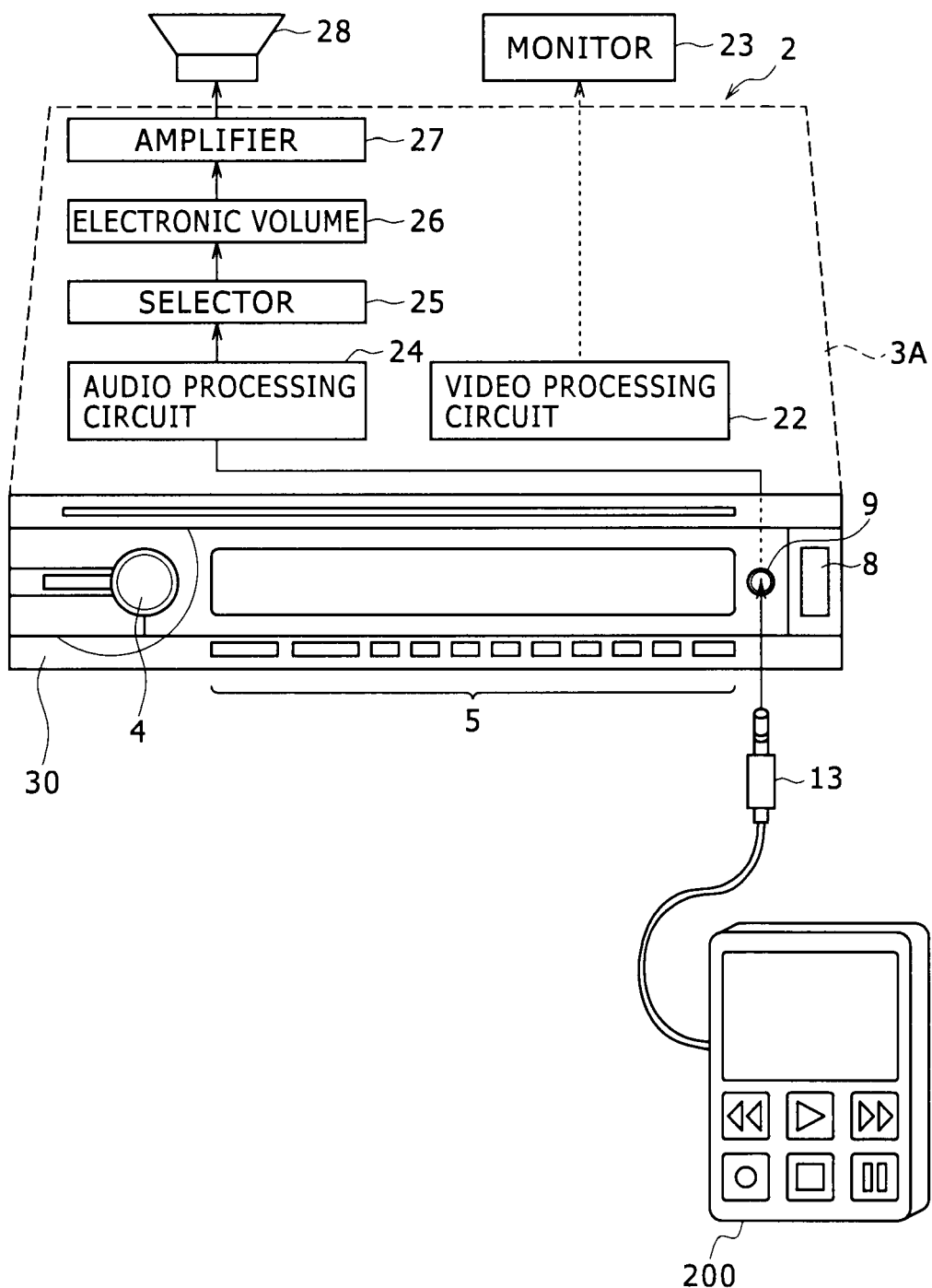
FIG. 8 is a schematic diagram for explaining signal flow when analog audio is input.

As shown in FIG. 8, if only the audio three-pole plug 13 of the portable analog audio player 200 is inserted into the AUX/VIN terminal 9, the car audio device 2 makes the transistor Tr1 of the input control circuit 21 carry out off-operation to thereby output an analog audio signal from the audio three-pole plug 13 via the audio processing circuit 24 to the speaker 28.

Figure 9:
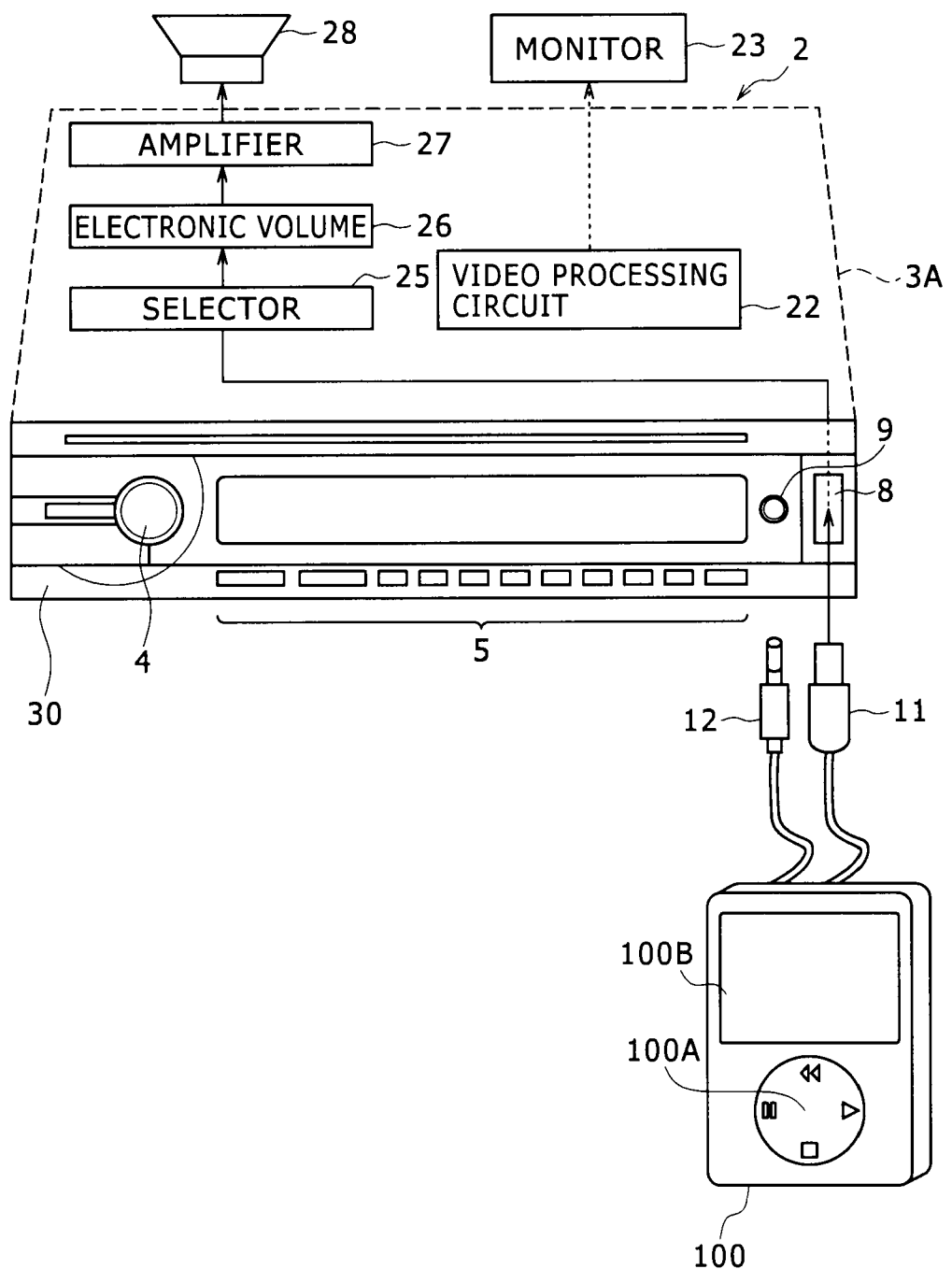
FIG. 9 is a schematic diagram for explaining signal flow when digital audio is input.

Furthermore, as shown in FIG. 9, if only the USB connector 11 of the portable digital player 100 is inserted into the USB terminal 8, the car audio device 2 outputs the digital audio data D1 from the USB connector 11 via the selector 25 to the speaker 28 irrespective of the transistor Tr1 of the input control circuit 21.

Figure 10:
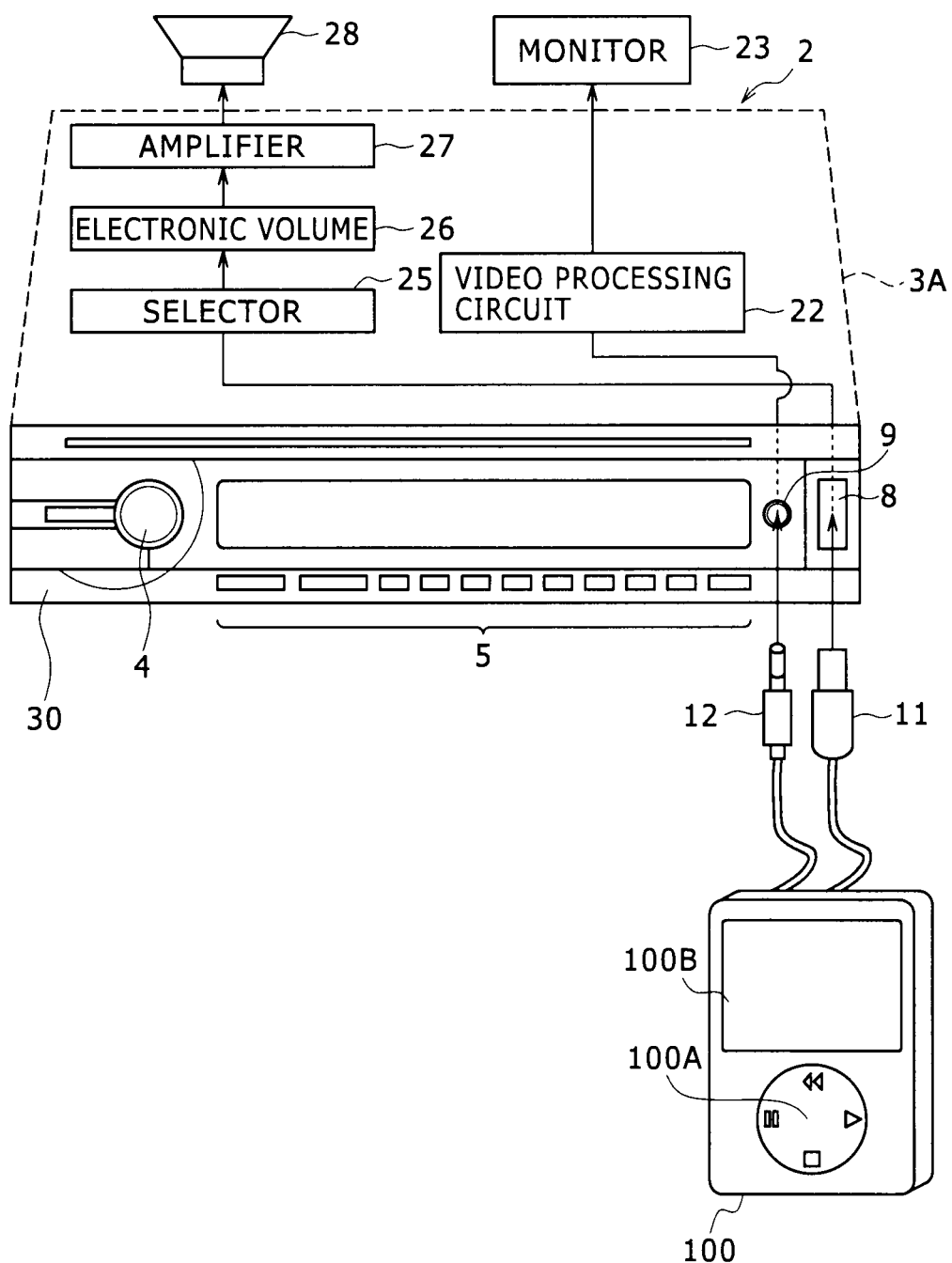
FIG. 10 is a schematic diagram for explaining signal flow when analog video is input.

Moreover, as shown in FIG. 10, if the USB connector 11 of the portable digital player 100 is inserted into the USB terminal 8 and the video two-pole plug 12 is inserted into the AUX/VIN terminal 9, the car audio device 2 makes the transistor Tr1 of the input control circuit 21 carry out on-operation.

This enables the car audio device 2 to send an analog video signal from the video two-pole plug 12 to the monitor 23 via the input control circuit 21 and the video processing circuit 22 and display reproduced video of moving image content.

Simultaneously, the car audio device 2 sends the digital audio data D1 from the USB connector 11 to the speaker 28 via the USB terminal 8 and the selector 25, and thereby can output reproduced audio of this moving image content.

In the above-described manner, the car audio device 2 can realize also reproduction output of an analog video signal in reproduction of moving image content by using one AUX/VIN terminal 9 also as the terminal for the analog video signal, in addition to reproduction output of an analog audio signal by the portable analog audio player 200 and reproduction output of digital audio data in music reproduction by the portable digital player 100.

1-5. Operation and Advantageous Effects

In the above-described configuration, the car audio device 2 utilizes the characteristic that the difference between the resistance of the impedance matching resistor R1 (75Ω) provided in the input control circuit 21 and the input impedances of the video processing circuit 22 and the audio processing circuit 24 (30 KΩ, 10 KΩ), which are provided in parallel to the impedance matching resistor R1, is very large.

Thereby, in the car audio device 2, the input impedance $R_Z'$ of the whole of the input control circuit 21, the video processing circuit 22, and the audio processing circuit 24 from the viewpoint of the side of the AUX/VIN terminal 9 is 74.257Ω, which is almost equal to 75Ω.

Due to this feature, in the car audio device 2, even when the video two-pole plug 12 of the portable digital player 100 is connected to the AUX/VIN terminal 9 and the transistor Tr1 of the input control circuit 21 is made to carry out on-operation, the output impedance when an analog video signal is output from the video two-pole plug 12 matches the input impedance $R_Z$ of the whole of the input control circuit 21 and the video processing circuit 22.

Thus, in the car audio device 2, the image quality can be maintained without variation of the signal level of the analog video signal even when the analog video signal is supplied from the video two-pole plug 12 of the portable digital player 100 via the AUX/VIN terminal 9.

In the car audio device 2, in practice, not only the video processing circuit 22 (30 KΩ) but also the audio processing circuit 24 is connected in parallel to the impedance matching resistor R1 (75Ω). However, because the input impedance of the audio processing circuit 24 (10 KΩ) is very high similarly to the video processing circuit 22, there is almost no influence and no inconvenience is caused in the impedance matching also in this case.

If an analog audio signal is supplied from the audio three-pole plug 13 of the portable analog audio player 200 via the AUX/VIN terminal 9, the car audio device 2 makes the transistor Tr1 of the input control circuit 21 carry out off-operation and thereby can output audio via the audio processing circuit 24 as with the related art.

As just described, in the car audio device, the AUX/VIN terminal 9 is allowed to have a double-purpose structure compatible with both of the audio three-pole plug 13 of the portable analog audio player 200 and the video two-pole plug 12 of the portable digital player 100. This provides higher general versatility.

Due to the above-described configuration, the car audio device 2 in the car audio system 1 has high general versatility because the AUX/VIN terminal 9 is compatible with not only the audio three-pole plug 13 of the portable analog audio player 200 but also the video two-pole plug 12 of the portable digital player 100.

Thus, in the car audio device 2 of the car audio system 1, merely through insertion of the video two-pole plug 12 of the portable digital player 100 into the AUX/VIN terminal 9 by the user, an analog video signal can be captured from this video two-pole plug 12 and video can be output on the monitor 28 without making the user carry out cumbersome operation.

Furthermore, in the car audio device 2, compared with the input impedance of the whole of the input control circuit 21 and the video processing circuit 22 from the viewpoint of the AUX/VIN terminal 9 (about 75Ω), the input impedance of the audio processing circuit 24 (10 KΩ) connected in parallel is so higher as to be ignorable. Therefore, the video input side is not affected by the audio input side.

Moreover, the car audio device 2 employs not an analog switch circuit but the transistor Tr1 involving no contact resistance as a switching element to switch the output destination of an analog video signal from the video two-pole plug 12 and the output destination of an analog audio signal from the audio three-pole plug 13. This can suppress signal level variation of the analog video signal and prevent the deterioration of the image quality.

2. Other Embodiments

In the above-described embodiment, the NPN transistor Tr1 is used. However, the present invention is not limited thereto but a PNP transistor may be used.

In the above-described embodiment, upon detection of connection of the USB connector 11 to the USB terminal 8, connection of the portable digital player 100 is recognized, and switching of the selector 25 and the on/off-operation of the transistor Tr1 are controlled. However, the present invention is not limited thereto. A vertical synchronizing signal of an analog video signal input from the video two-pole plug 12 may be detected, and switching of the selector 25 and the on/off-operation of the transistor Tr1 may be controlled depending on whether the detection is present or absent.

In the above-described embodiment, upon detection of connection of the USB connector 11 to the USB terminal 8, connection of the portable digital player 100 is recognized, and switching of the selector 25 and the on/off-operation of the transistor Tr1 are controlled. However, the present invention is not limited thereto but a connection line that is connected to the audio R-channel terminal 13R of the audio three-pole plug 13 when the audio three-pole plug 13 is inserted into the AUX/VIN terminal 9 may be monitored. In this case, when the video two-pole plug 12 is connected, this connection line is not connected to the audio R-channel terminal 13R but grounded. Thus, switching of the selector 25 and the on/off-operation of the transistor Tr1 may be controlled when this grounded state is detected.

In the above-described embodiment, the car audio system 1 as an in-vehicle apparatus system is constructed by connecting the portable digital player 100 or the portable analog audio player 200 to the car audio device 2 as an in-vehicle apparatus. However, the present invention is not limited thereto but a car audio system as an in-vehicle apparatus system may be constructed by connecting a new portable digital player having all of the USB connector 11, the video two-pole plug 12, and the audio three-pole plug 13.

The above-described embodiment relates to the car audio device 2 having the main body part 3A formed into the 1-DIN size. However, the present invention is not limited thereto but may be applied to a car audio device having the main body part 3A formed into any of other various sizes such as the 2-DIN size.

In the above-described embodiment, the NPN transistor Tr1 is used as the switching element. However, the present invention is not limited thereto but a PNP transistor may be used.

In the above-described embodiment, the transistor Tr1 is provided as the switching element at a position that is not on the connection line for transmitting an analog video signal from the AUX/VIN terminal 9 to the video processing circuit 22. However, the present invention is not limited thereto but a relay switch circuit may be used instead of the transistor Tr1 because the position at which the transistor Tr1 is provided is not on the connection line for transmitting an analog video signal and the contact resistance has no direct influence on the transmission.

In the above-described embodiment, the car audio device 2 as the in-vehicle apparatus of the present invention is configured by the main body part 3A as the main body part, the AUX/VIN terminal 9 as the analog input terminal, the video processing circuit 22 as the video processing circuit, the audio processing circuit 24 as the audio processing circuit, the input control circuit 21 as the input control circuit having the impedance matching resistor R1 as the resistor for impedance matching and the transistor Tr1 as the transistor, and the microcomputer 30 as the control circuit. However, the present invention is not limited thereto but the in-vehicle apparatus of the present invention may be configured by the main body part, the analog input terminal, the video processing circuit, the audio processing circuit, the input control circuit having the resistor for impedance matching and the transistor, and the control circuit that are based on other various configurations.

The in-vehicle apparatus and the in-vehicle apparatus system of the present invention can be applied to, besides the car audio device 2, e.g. a cellular phone device, a game machine, and a personal navigation device (PND) that have such a configuration as to allow outputting of an analog video signal by a video two-pole plug.

The present application contains subject matter related to that disclosed in Japanese Priority Patent Application JP 2009-255176 filed in the Japan Patent Office on Nov. 6, 2009, the entire content of which is hereby incorporated by reference.

While preferred embodiments of the present invention have been described using specific terms, such description is for illustrative purposes only, and it is to be understood that changes and variations may be made without departing from the spirit or scope of the following claims.

What is claimed is:

1. An in-vehicle apparatus comprising:
a main body part configured to have a front panel of a predetermined size;
an analog input terminal configured to be provided in the front panel, an analog audio signal or an analog video signal supplied from an external three-pole plug being input to the analog input terminal;
a video processing circuit configured to be connected to an audio L-channel terminal and a ground terminal of the three-pole plug and execute predetermined signal processing for the analog video signal;
an audio processing circuit configured to be connected to the audio L-channel terminal, an audio R-channel terminal and the ground terminal of the three-pole plug and execute predetermined signal processing for the analog audio signal;
an input control circuit including a transistor, a first resistor, a second resistor and a third resistor, wherein
the first resistor is provided between the audio L-channel terminal of the three pole plug and a collector of the transistor and functions for impedance matching for the analog video signal,
the second resistor is provided between a base of the transistor and a microcomputer,
the third resistor is provided between the ground terminal of the three-pole plug and the base of the transistor,
an emitter of the transistor is connected to the ground terminal of the three-pole plug, and
the microcomputer is configured to allow impedance matching through the first resistor for impedance matching by making the transistor carry out on-operation if a signal supplied via the analog input terminal is the analog video signal, and make the analog audio signal be input to the audio processing circuit by making the transistor carry out off-operation if a signal supplied via the analog input terminal is the analog audio signal.

2. The in-vehicle apparatus according to claim 1, wherein the first resistor for impedance matching is connected in parallel to the video processing circuit and the audio processing circuit.

3. The in-vehicle apparatus according to claim 2, wherein input impedance of the video processing circuit and input impedance of the audio processing circuit have such a large value as to be ignorable compared with the first resistor for impedance matching.

4. The in-vehicle apparatus according to claim 3, further comprising:
a digital input terminal configured to be provided in the front panel, digital audio data supplied from the external being input to the digital input terminal.

5. An in-vehicle apparatus system comprising:
an in-vehicle apparatus; and
a player connected to the in-vehicle apparatus,
the in-vehicle apparatus including
a main body part configured to have a front panel of a predetermined size,
an analog input terminal configured to be provided in the front panel, an analog audio signal supplied from a three-pole plug of the player being input to the analog input terminal,
a video processing circuit configured to be connected to an audio L-channel terminal and a ground terminal of the three-pole plug and execute predetermined signal processing for the analog video signal,
an audio processing circuit configured to be connected to the audio L-channel terminal, an audio R-channel terminal and the ground terminal of the three-pole plug and execute predetermined signal processing for the analog audio signal,
an input control circuit including a transistor, a first resistor, a second resistor and a third resistor, wherein
the first resistor is provided between the audio L-channel terminal of the three pole plug and a collector of the transistor and functions for impedance matching for the analog video signal,
the second resistor is provided between a base of the transistor and a microcomputer,
the third resistor is provided between the ground terminal of the three-pole plug and the base of the transistor,
an emitter of the transistor is connected to the ground terminal of the three-pole plug, and
the microcomputer configured to allow impedance matching through the first resistor for impedance matching by making the transistor carry out on-operation if a signal supplied via the analog input terminal is the analog video signal, and make the analog audio signal be input to the audio processing circuit by making the transistor carry out off-operation if a signal supplied via the analog input terminal is the analog audio signal.

* * * * *